US006321357B1

(12) United States Patent
Ouyang

(10) Patent No.: US 6,321,357 B1
(45) Date of Patent: Nov. 20, 2001

(54) METHOD AND APPARATUS FOR BURST ERROR CORRECTION

(75) Inventor: Jing Zheng Ouyang, San Jose, CA (US)

(73) Assignee: Innomedia Pte Ltd, Singapore (SG)

( * ) Notice: Subject to any disclaimer, the term of this patent is extended or adjusted under 35 U.S.C. 154(b) by 0 days.

(21) Appl. No.: 09/320,165

(22) Filed: May 26, 1999

Related U.S. Application Data

(60) Provisional application No. 60/087,464, filed on May 31, 1998.

(51) Int. Cl.[7] ................................................. H03M 13/17
(52) U.S. Cl. ................................................. 714/762
(58) Field of Search ............................................. 714/762

(56) References Cited

U.S. PATENT DOCUMENTS

| | | | |
|---|---|---|---|
| 4,633,486 | 12/1986 | Berlekamp et al. | 375/116 |
| 4,835,772 | 5/1989 | Peile et al. | 371/2 |
| 4,916,702 | * 4/1990 | Berlekamp | 371/39.1 |
| 5,299,208 | 3/1994 | Blaum | 371/38.1 |
| 5,629,949 | * 5/1997 | Zook | 371/37.1 |
| 5,631,909 | * 5/1997 | Weng et al. | 371/5.1 |
| 5,684,810 | * 11/1997 | Nakamura et al. | 371/37.4 |
| 5,943,348 | * 8/1999 | Ly | 371/38.1 |

FOREIGN PATENT DOCUMENTS 0136 604 A    4/1985   (EP) .

* cited by examiner

Primary Examiner—Stephen M. Baker
(74) Attorney, Agent, or Firm—McCutchen, Doyle, Brown & Energen, LLP

(57) ABSTRACT

A method and apparatus for improving burst error correction. The method and apparatus involve transmitting block codes with interleaving, and predicting a burst error in the received block codes. Burst error prediction includes decoding received block codes and determining if the decoding is successful. The method includes receiving a code having an error correction capability, an erasure detection capability and a burst error length associated with it. A decoding step is performed to find an error in the code. The error has a length associated with it. The decoding is successful if the error length found is less than twice the error correction capability. If an initial decode attempt is not successful, then a burst error length is associated with the code and another decode is performed. The burst error length has an initial value that is less than the error correction capability. The burst error length is incremented by a predetermined amount after each unsuccessful decode until the burst error length exceeds twice the error correction capability, at which point the decode is assumed to have failed.

18 Claims, 5 Drawing Sheets

METHOD AND APPARATUS FOR BURST ERROR CORRECTION

RELATED APPLICATIONS

Applicant claims priority to and hereby incorporates by reference U.S. Provisional Application Ser. No. 60/087,464, entitled "Method and Apparatus for Burst Error Correction" of Jing-Zheng Ouyang, filed on May 31, 1998.

FIELD OF THE INVENTION

The present invention relates to error prediction and correction in data communications. More particularly, the present invention provides a method and apparatus for burst error prediction and correction.

BACKGROUND

When information is transmitted and received over a communications channel, errors sometimes occur. In order to guarantee the reliability of the message being transmitted or received, it is necessary to be able to detect these errors. Error detection is the process of determining whether information that was received is the same as the information that was sent. Once the error is detected, it may be corrected.

An example of an error that may occur in communications systems is a burst error. A burst error occurs when a number of bits in a sequence are erroneously set to the same value. FIG. 1a shows an example of a burst error in a block code 100 that contains 18 symbols 102. The burst error starts at location 6 and has a length b=3. Burst errors may be caused by erasures or random errors. Symbols that are correct are shown as empty circles, for example symbol 102. Symbols representing an error are shown as filled-in circles 104. Block code 100 has errors 104 at locations 6, 7 and 8. The remaining symbols 102, shown at locations 1–6 and 9–18, do not contain errors.

Erasure errors are the result of gaps in an information stream. For example, if information is being read from a tape and a section of the tape has been erased, an erasure error has occurred. Another example of an erasure error is when information is transmitted over a communications line that is hit by lightning during a thunderstorm. The disruption in the communications cable caused by the lightning is where the erasure error has occurred. Random errors are the result of incorrect information being transmitted. Random errors are unpredictable and need to be detected because they cause data corruption.

Existing methods for detecting errors include sending additional information along with the desired message to be transmitted. This additional information, or redundancy, is used to determine whether the message contains errors. Examples of existing error correction schemes using redundancy include cyclic redundancy checks (CRC), checksum, and Reed-Solomon codes. A Reed-Solomon code is a block code that contains a total of n symbols, and a block of k (where k<n) information symbols within the block code. The k information symbols contain the message to be transmitted or received.

Assuming that k symbols make up the desired message, the remaining n-k symbols are check symbols that may be used for error correction processing. These codes are commonly indicated by the notation (n, k).

FIG. 1b shows an example of a (18, 6) Reed-Solomon code 140. Each symbol 102 is represented by a circle. Code 140 contains n=18 total symbols. The message contains k=6 symbols. The error correction portion contains n−k=12 symbols. "On TMS320 Microprocessor Base Programmable Real Time Reed-Solomon Coding-Decoding System", International Journal of Satellite Communication, Vol. 8, April 1990, written by Jing-Zheng Ouyang, discusses Reed-Solomon codes in more detail, and is hereby incorporated by reference. Also incorporated by reference is R.E. Blahut, "Theory and Practice of error Control Codes," Addison Wesley Publishing Company, Inc. 1983.

Each block code has an error correction capability, t, associated with it. T is expressed in terms of burst error length (number of symbols). This error correction capability, t, is a function of the type of error and a minimum distance, d*, corresponding to a maximum likelihood that an error may be detected. The random error correction capability of an (n, k) block code satisfies the following equation (1):

$$d^* \geq 2t+1 \tag{1}$$

This equation may be expressed in terms of random errors, v, and erasure errors, r, resulting in the following equation (2):

$$d^* \geq 2v+r+1 \tag{2}$$

Equation (2) reflects that random errors require a greater minimum distance for correction. In other words, the erasure correction capability is larger than the random error capability. If it can be assumed that only erasure errors, r, occurred, then equation (2) may be simplified to equation (3):

$$d^* > r+1 \tag{3}$$

FIG. 1c shows an example of an (n, k) block code 170 having random error correction capability t=3. If more errors than t appear in a sequence, then the error for that block code cannot be corrected. For example, block code 170 contains errors 104 in positions 4, 8, 12, and 16. The burst error length is b=1 because each error 104 is not adjacent to any other error. In this case, however, even though b<t, the errors may not be corrected. From a random errors point of view, the number of errors, 4, is still greater than t (t=3) and therefore no correction can be had. Also, from the point of view of burst errors, a total of 12 errors beginning from 104 at location 4 is greater than t=3 and, likewise cannot be corrected. Hence, if in the block code there were no more than t errors 104, for example as shown in FIG. 1a, where the burst error length b=3, then the error can be corrected because b=t. Similarly, block codes containing burst error length b>t also could not be corrected.

Burst error length occurring in applications such as communications and data storage/retrieval presents a problem because it is unpredictable. An error correction capability t may be chosen to accommodate the longest burst error possible, i.e., the largest b value. The tradeoff is that a system that has a very high error correction capability requires more time and resources to process messages. Therefore, a need exists for maximizing the error correction capability of block codes. The present invention addresses this and related problems.

SUMMARY OF THE INVENTION

The present invention provides burst error prediction to maximize the error correction capability of block codes. A method an apparatus in accordance with the present invention for improving burst error correction involve transmitting block codes with interleaving, and predicting a burst error in the received block codes. Burst error prediction includes decoding received block codes and determining if the decoding is successful as will be further explained below. The received block codes have an error correction capability, an erasure detection capability and a burst error. Hence, a decoding step is performed to find the burst error in the block code. The burst error has a length associated therewith. The decoding is successful if the burst error length found is less than twice the error correction capability. If an initial decode attempt is not successful, then an initial burst error length is associated with the block code and another decode is performed. The burst error length has an initial value that is less than the error correction capability. After each unsuccessful decode, the burst error length is incremented by a predetermined amount until the burst error length exceeds twice the error correction capability, at which point the decode is assumed to have failed.

BRIEF DESCRIPTION OF THE DRAWINGS

The accompanying drawings, which are incorporated in and constitute a part of this specification, illustrate several embodiments of the invention and, together with the description, serve to explain the principles of the invention.

DETAILED DESCRIPTION OF PREFERRED EMBODIMENTS

Reference will now be made in detail to several embodiments of the present invention, examples of which are illustrated in the accompanying drawings. Wherever practicable, the same reference numbers will be used throughout the drawings to refer to the same or like parts.

Figure 2:
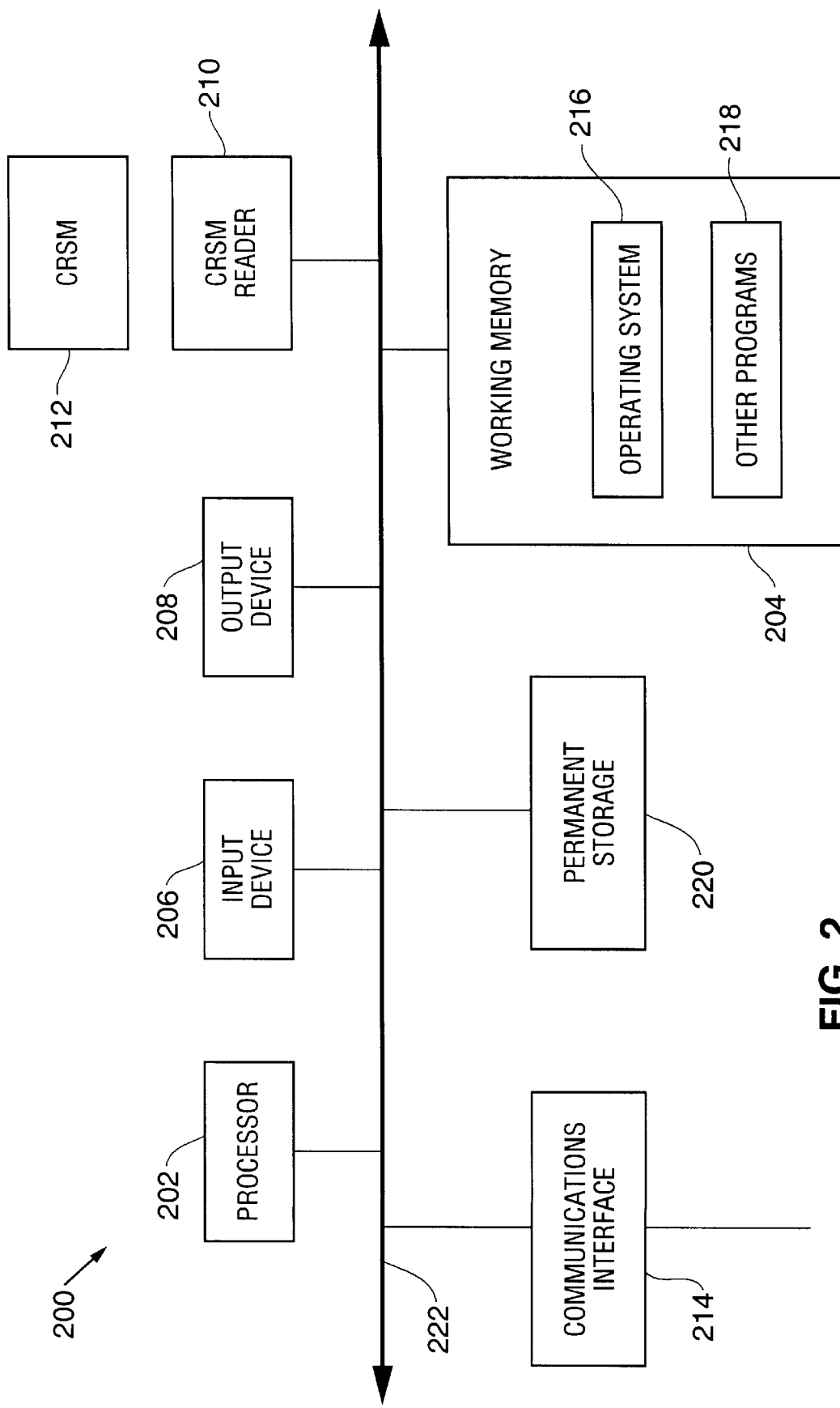
FIG. 2 is a block diagram of a data processing system in accordance with an embodiment of the present invention.

FIG. 2 is a diagram of a data processing system 200 in accordance with a preferred embodiment of the present invention. System 200 may include processor 202 and storage area (working memory) 204 connected via interface connection 222. Additional storage may be provided by permanent storage 220. Storage area 204 may include, among other elements, an operating system 216 and other programs 218, for example, burst error prediction/correction software. Similar software may be included in the elements of FIG. 3.

System 200 may include an input device 206, such as a keyboard, a touchpad, or a mouse that receives input from a user or other appropriate source. Although the present invention is described in terms of a system in which the user enters inputs and responses using a computer mouse, any appropriate input device can be used. System 200 also may include an output device 208, such as a display screen, that outputs information to the user or other appropriate destination. In addition, system 200 may include a computer readable storage medium input device 210, which is capable of reading a computer readable storage medium 212.

A person of ordinary skill in the art will understand that the system of FIG. 2 may also contain additional elements, such as input/output lines; input devices, such as a keyboard, a mouse, and a voice input device; and additional display devices. The system of FIG. 2 may also may include application programs, operating systems, data, etc., which are not shown in the figure for the sake of clarity. It will be further understood that the system of FIG. 2 can include additional elements not shown, such as disk drives, keyboards, display devices, network connections, additional memory, additional CPUs, additional processors, LANs, input/output lines, etc.

In the following discussion, It will be understood that the steps of methods and flow charts discussed preferably are performed by processor 202 (or other appropriate processors) executing instructions stored in respective storage areas 204 (or other appropriate storage areas). Specifically, the steps described herein are performed by processor 202 executing the error prediction/correction software. It will also be understood that the invention is not limited to any particular implementation or programming technique and that the invention may be implemented using any appropriate techniques for implementing the functionality described herein. The invention is not limited to any particular programming language, operating system, or network protocol.

Some or all of the instructions and data structures in storage areas 204 may be read into memory from computer-readable storage media 212. Execution of sequences of instructions contained in the storage areas causes processor 202 to perform the process steps described herein. In alternative embodiments, hard-wired circuitry may be used in place of or in combination with software instructions to implement the invention. Thus, preferred embodiments of the invention are not limited to any specific combination of hardware circuitry and software.

The term "computer-readable storage medium" as used herein refers to any medium that participates in providing instructions to a processor for execution. Such a medium may take many forms, including but not limited to, non-volatile media, volatile media, and transmission media. Non-volatile media includes, for example, optical or magnetic disks, such as a storage device. Volatile media includes dynamic memory. Transmission media include coaxial cables, copper wire and fiber optics, including the wires that comprise a bus within a computer. Transmission media can also take the form of acoustic or light waves, such as those generated during radio-wave and infra-red data communications, or electrical signals transmitted over a computer network.

Common forms of computer-readable media include, for example a floppy disk, a flexible disk, a hard disk, magnetic tape, or any other magnetic medium, a CD-ROM, any other optical medium, punchcards, papertapes, any other physical medium with patterns of holes, a RAM, a PROM, an EPROM, a FLASH-EPROM, any other memory chip or cartridge, a carrier wave as described hereafter, or any other medium from which a computer can read.

Various forms of computer readable media may be involved in carrying one or more sequences of one or more instructions to a processor for execution. For example, the instructions of the software may initially be carried on a magnetic disk or a tape. The instructions are loaded into storage area 204. Alternately, instructions can be sent over a telephone line using a modem. A modem local to the computer system can receive the data on the telephone line and use an infra-red transmitter to convert the data to an infra-red signal. An infra-red detector coupled to a bus can receive the data carried in the infra-red signal and place the data on the bus. The bus 222 carries data to main memory, from which a processor retrieves and executes the instructions. The instructions received by main memory may optionally be stored on a storage device either before or after execution by a processor. System 200 may also include a communications interface 214 for connection to other nodes in a network.

Figure 1A:
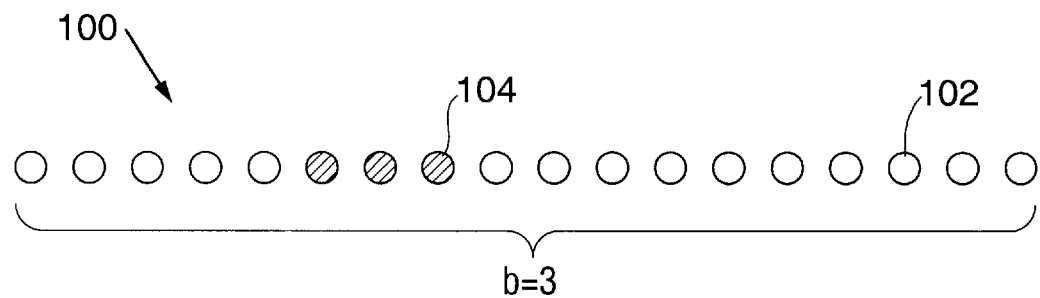
FIGS. 1a–c each a diagram showing a block code processed by an embodiment of the present invention.
Figure 1B:
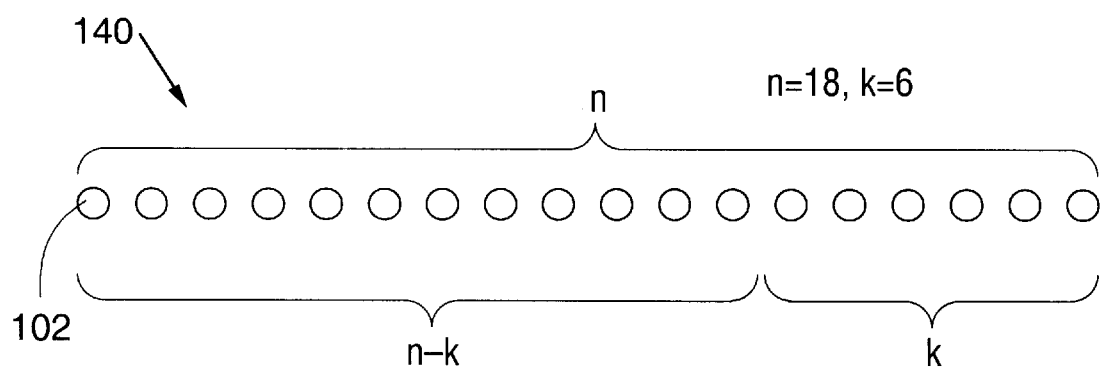
Figure 1C:
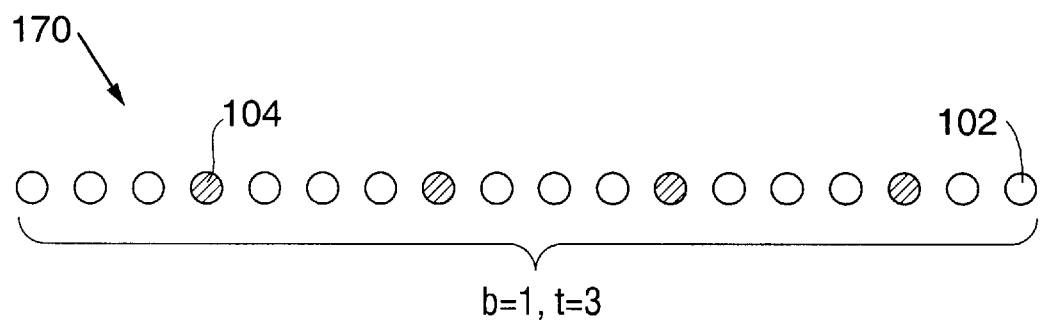
Figure 3:
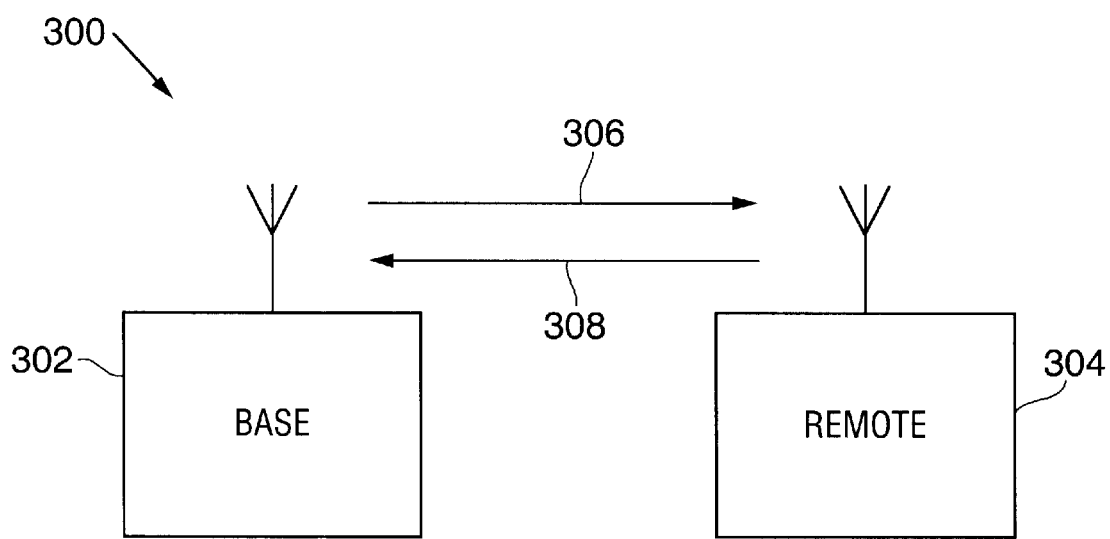
FIG. 3 is a block diagram of a transmitter and receiver in accordance with an embodiment of the present invention.

FIG. 3 is a block diagram 300 of a base unit 302 and a remote unit 304 in accordance with a preferred embodiment of the present invention. The error prediction/correction software is generally present in at least one and preferably all units that receive data. In FIG. 3, both the base unit 302 and the remote unit 304 send and receive data, as shown by arrows 306, 308. The block codes described in the discussion of FIGS. 1a–c are an example of the kinds of data that may be sent and received by base unit 302 and remote unit 304. Improving burst error correction capability in accordance with an embodiment of the present invention involves transmitting block codes of type (n, k) block code with interleaving and predicting a burst error in the received block codes. Burst error prediction includes decoding received block codes and determining if the decoding is successful as will be further explained below.

In order to understand the advantage of transmission with interleaving, assume that V1, V2, V3, . . . , Vm are m block codes of type (n, k) block code. Reed-Solomon codes are an example of such block codes. Each of the m block codes includes n symbols, as follows:

V1=(v1$_1$, v1$_2$, . . . , v1$_n$)
V2=(v2$_1$, v2$_2$, . . . , v2$_n$)
Vm=(vm$_1$, vm$_2$, . . . , vm$_n$)

When the symbols of the block codes V1, V2, . . . , Vm are transmitted without interleaving, the sending sequence of the symbols is v1$_1$, v1$_2$, . . . , v1$_n$, v2$_1$, v2$_2$, . . . , v2$_n$, . . . , vm$_1$, vm$_2$, . . . , vm$_n$. This reflects sending whole block codes in sequence, i.e., V1, V2, . . . , Vm. The effect of transmitting block codes in this manner is that a burst error of length b causes b errors in each block code.

When, alternatively, the symbols of the block codes V1, V2, . . . , Vm are transmitted with interleaving, the sending sequence of the symbols is v1$_1$, v2$_1$, vm$_1$, v1$_2$, v2$_2$, . . . , vm$_2$, . . . , v1$_n$, v2$_n$, . . . vm$_n$. An advantage of interleaving is that the burst error is spread out over the m block codes, so that a burst error of length b causes at most b/m errors in each block code. Thus, increasing m increases the overall burst correction capability for the block codes V1–Vm.

It is noted, however, that if m is chosen to be too high, it takes more time to transmit the block of codes V1–Vm. Also, as m increases, more memory is required to store the additional V1–Vm block codes. Therefore, a preferred value for m is m=3.

In addition to employing transmission with interleaving, the burst error correction capability is improved by burst error prediction. To that end, it is assumed that an error in the the symbol is most likely to produce an (n,k) block code having a burst error of length b starting from the ith symbol location. A received block code can be decoded based on a burst error patterns with the length b starting at the ith location. If b<=2t, then the decode is successful.

Figure 4:
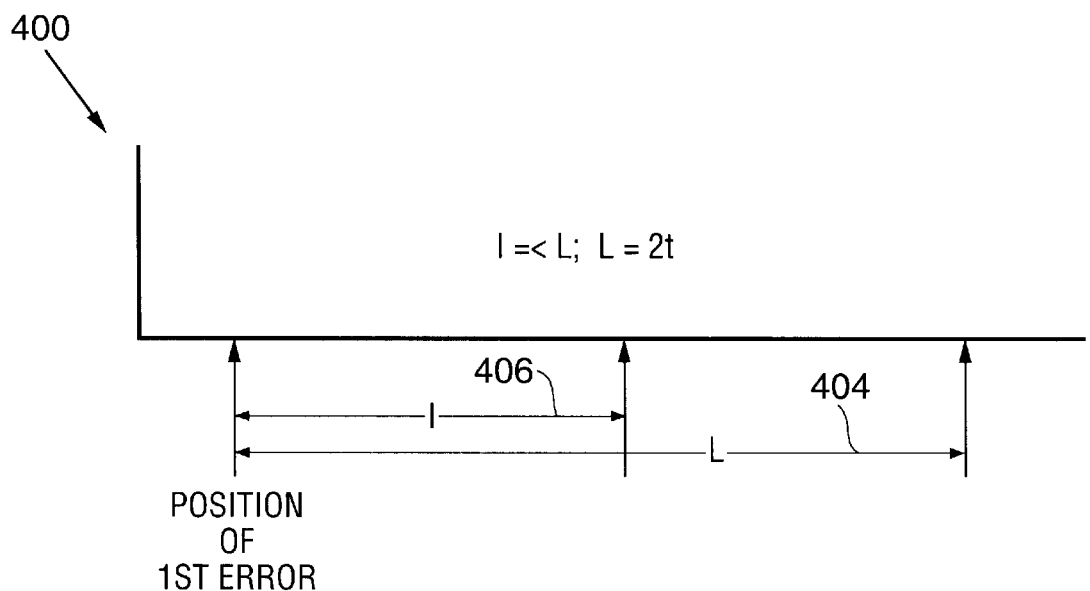
FIG. 4 is a graph showing values associated with block codes such as those illustrated in FIGS. 1a–c.

FIG. 4 is a graph showing values associated with block codes such as those shown in FIGS. 1a–c. The significance of these values is that they are used in connection with burst error prediction. As noted above, burst error prediction involves decoding and determining if the decoding is successful, i.e., if b<=2t. Hence, in an embodiment of the present invention, a first decode of a block code is performed. If the first decode fails, then an assumed burst error length, I, is set to an initial value corresponding to a first error length, as shown by arrow 406. A second decode is performed after setting the assumed burst error length, I, to the initial value. Preferably, this initial value is lower than or equal to the random error correction capability of the block code, t. The random error correction capability is t (not shown). The assumed burst error length, I, may be incremented during each subsequent decode by an increment, p (p>=1; not shown). The value of L, shown as 404, corresponds to a maximum burst/erasure error correction of the code, i.e., L=2t. If the value of the assumed burst error length, I, becomes equal to or exceeds L, i.e., twice the value of t, then the decode is assumed to have failed.

Figure 5:
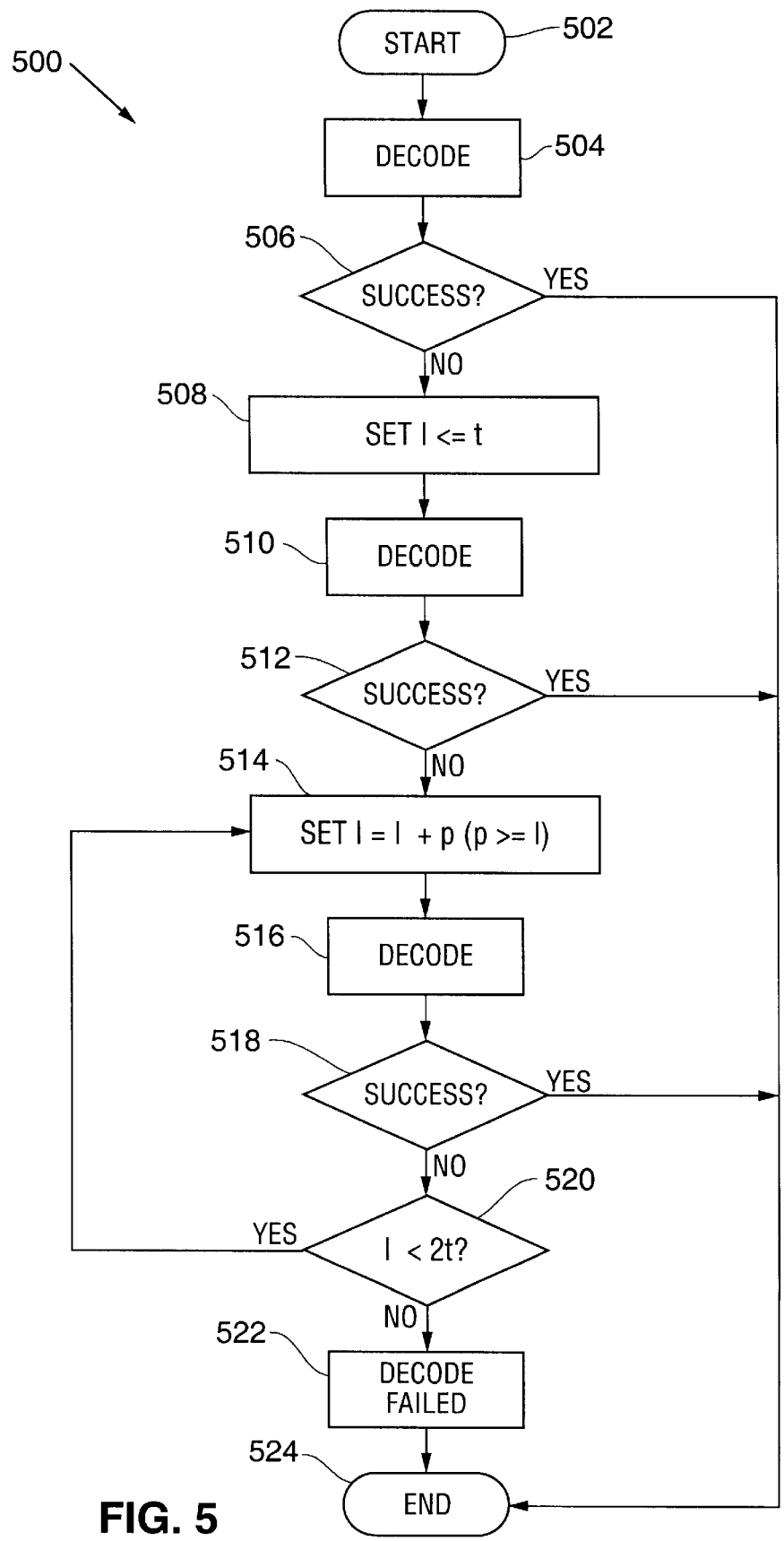
FIG. 5 is a flowchart illustrating in more detail the burst error prediction in accordance with an embodiment of the invention.

FIG. 5 is a flowchart 500 illustrating in more detail the burst error prediction in accordance with an embodiment of the invention, beginning at step 502. A first decode step 504 is performed on a block code, for example, a Reed-Solomon code as described above. A determination is made as to whether the decode was successful in step 506. A decode is successful if the number of symbols fund to be in error does not exceed 2t, twice the error correction capability of the block code. If the first decode step 504 is successful, then processing ends, step 524. If the first decode step 504 is not successful, then in step 508 an initial assumed burst error length, I, is set to a value that is, for example, less than or equal to the random error correction capability t.

A second decode step 510 is performed using the value set in step 508. If the second decode step 510 is successful, then processing ends, step 524. If the second decode step 510 is not successful, then the value of the assumed burst error length, I, is incremented by a predetermined amount, p, in step 514. The value of p may be set to any appropriate indexing value, for example, 1, 2, 3, or 4. Typically, p will be greater than one.

After incrementing the value of the assumed burst error length, I, by an amount equal to p in step 514, a third decode is performed in step 516. If decode step 516 is successful, then processing ends at step 524. If decode step 516 is not successful, then a determination is made in step 520 as to whether the value of the assumed burst error length, I, has become equal to or has exceeded a value equal to twice the value of the maximum random error correction capability, t.

If the assumed burst error length, I, has become equal to or has exceeded a value equal to twice the value of the maximum random error correction capability, t, i.e., if I>=2t, then the decoding process is assumed to have failed, step 522, and processing ends, step 524. Otherwise, if at step 520 it is determined that the assumed burst error length, I, is still less than a value equal to twice the value of the maximum random error correction capability, t, i.e., if I<2t, then processing continues at step 514 and the assumed burst error length, I, is incremented by the index p again.

In summary, the present invention provides burst error prediction method and apparatus to maximize the error correction capability of block codes. Other embodiments will be apparent to those skilled in the art from consideration of the specification and practice of the invention disclosed herein. It is intended that the specification and examples be considered as exemplary only, with a true scope of the invention being indicated by the following claims and equivalents.

What is claimed is:

1. A method for improving burst error correction, comprising: implementing transmission of codes with interleaving, each of the codes having error correction capability; and implementing prediction of burst errors in received codes; the prediction including:

receiving a code;
decoding the code to find a length of the burst error; and
determining whether the decoding is successful by determining whether the burst error length is less than twice the error correction capability.

2. A method as recited in claim 1, wherein the prediction further includes:
associating an assumed burst error length with the code if the decode is not successful, wherein the assumed burst error length is set to an initial value that is lower than or equal to the error correction capability;
progressively decoding the code as long as the assumed burst error length does not exceed twice the error correction capability, and, for each decoding, determining whether the decoding is successful by determining whether the assumed burst error length is less than twice the error correction capability and, if the decoding is unsuccessful, incrementing the assumed burst error length.

3. A method as recited in claim 1, wherein the prediction further includes:
associating an assumed burst error length with the code if the decode is not successful, wherein the assumed burst error length is set to an initial value that is lower than or equal to the error correction capability;
progressively decoding the code, wherein after each unsuccessful decoding the assumed burst error length is incremented by a predetermined amount until the burst error length exceeds twice the error correction capability, at which point the decoding is said to have failed.

4. A method as recited in claim 3, wherein the predetermined amount is equal to or greater than 1, but lower than twice the error correction capability.

5. A method as recited in claim 1, wherein a predetermined number of codes are transmitted with interleaving each time.

6. A method as recited in claim 5, wherein the predetermined number includes 3.

7. A system for improving burst error correction, comprising:
a transmission module implementing transmission of codes with interleaving, each of the codes having error correction capability; and
a predicting module implementing prediction of burst errors in received codes; the prediction module including:
a receiving module receiving a code;
a decoding module decoding the code to find a length of the burst error; and
a determining module determining whether the decoding is successful by determining whether the burst error length is less than twice the error correction capability.

8. A system as recited in claim 7, wherein the prediction module further includes:
an associating module associating an assumed burst error length with the code if the decode is not successful, wherein the assumed burst error length is set to an initial value that is lower than or equal to the error correction capability;
a progressive decoding module progressively decoding the code as long as the assumed burst error length does not exceed twice the error correction capability, and, for each decoding, determining whether the decoding is successful by determining whether the assumed burst error length is less than twice the error correction capability and, if the decoding is unsuccessful, incrementing the assumed burst error length.

9. A system as recited in claim 7, wherein the prediction module further includes:
an associating module associating an assumed burst error length with the code if the decode is not successful, wherein the assumed burst error length is set to an initial value that is lower than or equal to the error correction capability;
a progressive decoding module progressively decoding the code, wherein after each unsuccessful decoding the assumed burst error length is incremented by a predetermined amount until the burst error length exceeds twice the error correction capability, at which point the decoding is said to have failed.

10. A system as recited in claim 9, wherein the predetermined amount is equal to or greater than 1, but lower than twice the error correction capability.

11. A system as recited in claim 7 wherein a predetermined number of codes are transmitted with interleaving each time.

12. A method as recited in claim 11, wherein the predetermined number is set to 3.

13. An apparatus for improving burst error correction, comprising:
means for transmitting codes with interleaving, each of the codes having error correction capability; and
means for predicting of burst errors in received codes; the prediction means including:
means for receiving a code;
means for decoding the code to find a length of the burst error; and
means for determining whether the decoding is successful by determining whether the burst error length is less than twice the error correction capability.

14. An apparatus as recited in claim 13, wherein the prediction means further includes:
means for associating an assumed burst error length with the code if the decode is not successful, wherein the assumed burst error length is set to an initial value that is lower than or equal to the error correction capability;
means for progressively decoding the code as long as the assumed burst error length does not exceed twice the error correction capability, and, for each decoding, determining whether the decoding is successful by determining whether the assumed burst error length is less than twice the error correction capability and, if the decoding is unsuccessful, incrementing the assumed burst error length.

15. An apparatus as recited in claim 13, wherein the prediction means further includes:
means for associating an assumed burst error length with the code if the decode is not successful, wherein the assumed burst error length is set to an initial value that is lower than or equal to the error correction capability;
means for progressively decoding the code, wherein after each unsuccessful decoding the assumed burst error length is incremented by a predetermined amount until the burst error length exceeds twice the error correction capability, at which point the decoding is said to have.

16. A computer readable storage medium storing program code for causing a computer to perform steps for improving burst error correction, of:
transmitting codes with interleaving, each of the codes having error correction capability; and predicting burst errors in received codes; the prediction including:

receiving a code;

decoding the code to find a length of the burst error; and determining whether the decoding is successful by determining whether the burst error length is less than twice the error correction capability.

17. A computer readable storage medium as recited in claim 16, wherein the prediction further includes:

associating an assumed burst error length with the code if the decode is not successful, wherein the assumed burst error length is set to an initial value that is lower than or equal to the error correction capability;

progressively decoding the code as long as the assumed burst error length does not exceed twice the error correction capability, and, for each decoding, determining whether the decoding is successful by determining whether the assumed burst error length is less than twice the error correction capability and, if the decoding is unsuccessful, incrementing the assumed burst error length.

18. A computer readable storage medium as recited in claim 16, wherein the prediction further includes:

associating an assumed burst error length with the code if the decode is not successful, wherein the assumed burst error length is set to an initial value that is lower than or equal to the error correction capability;

progressively decoding the code, wherein after each unsuccessful decoding the assumed burst error length is incremented by a predetermined amount until the burst error length exceeds twice the error correction capability, at which point the decoding is said to have failed.

* * * * *